United States Patent
Chang et al.

(10) Patent No.: US 8,636,891 B2
(45) Date of Patent: Jan. 28, 2014

(54) COATED ARTICLE AND METHOD FOR MANUFACTURING SAME

(75) Inventors: Hsin-Pei Chang, Tu-Cheng (TW);
Wen-Rong Chen, Tu-Cheng (TW);
Huann-Wu Chiang, Tu-Cheng (TW);
Cheng-Shi Chen, Tu-Cheng (TW);
Cheng Zhang, Shenzhen (CN)

(73) Assignees: Hong Fu Jin Precision Industry (ShenZhen) Co., Ltd, Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 159 days.

(21) Appl. No.: 13/091,288

(22) Filed: Apr. 21, 2011

(65) Prior Publication Data
US 2012/0028030 A1     Feb. 2, 2012

(30) Foreign Application Priority Data
Jul. 28, 2010   (CN) .......................... 2010 1 0239092

(51) Int. Cl.
*C23C 22/05*    (2006.01)
(52) U.S. Cl.
USPC ............... 205/191; 428/315.7; 428/315.9; 204/192.12; 204/192.15; 204/157.15; 205/188

(58) Field of Classification Search
USPC ............................................. 204/157.15
See application file for complete search history.

(56) References Cited

U.S. PATENT DOCUMENTS 3,785,946 A  *  1/1974   Terai et al. ............... 205/188
6,083,354 A  *  7/2000   Deguchi et al. ........ 204/157.15

FOREIGN PATENT DOCUMENTS

CN             1986887 A       6/2007

OTHER PUBLICATIONS

Astle, Melvin J., and Robert C. Weast. CRC handbook of chemistry and physics : a ready-reference book of chemical and physical data. Boca Raton, Fla: CRC Press, 1983. Print.*

* cited by examiner

*Primary Examiner* — Keith Hendricks
*Assistant Examiner* — Timon Wanga
(74) *Attorney, Agent, or Firm* — Altis Law Group, Inc.

(57) ABSTRACT

A coated article includes a substrate, and a coating deposited on the substrate by magnetron sputtering. The coating includes micropores, and each micropore is sealed by a sealing element.

8 Claims, 3 Drawing Sheets

COATED ARTICLE AND METHOD FOR MANUFACTURING SAME

BACKGROUND

1. Technical Field

The disclosure generally relates to coated articles and method for manufacturing the coated articles.

2. Description of Related Art

For improving corrosion resistance of metal, physical vapor deposition (PVD) can be used to deposit a coating on a surface of the metal. However, coatings deposited by PVD typically contain micropores that can allow penetration of contaminants, such as air and moisture, which can corrode the metal.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary coated article and method for manufacturing the coated article. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
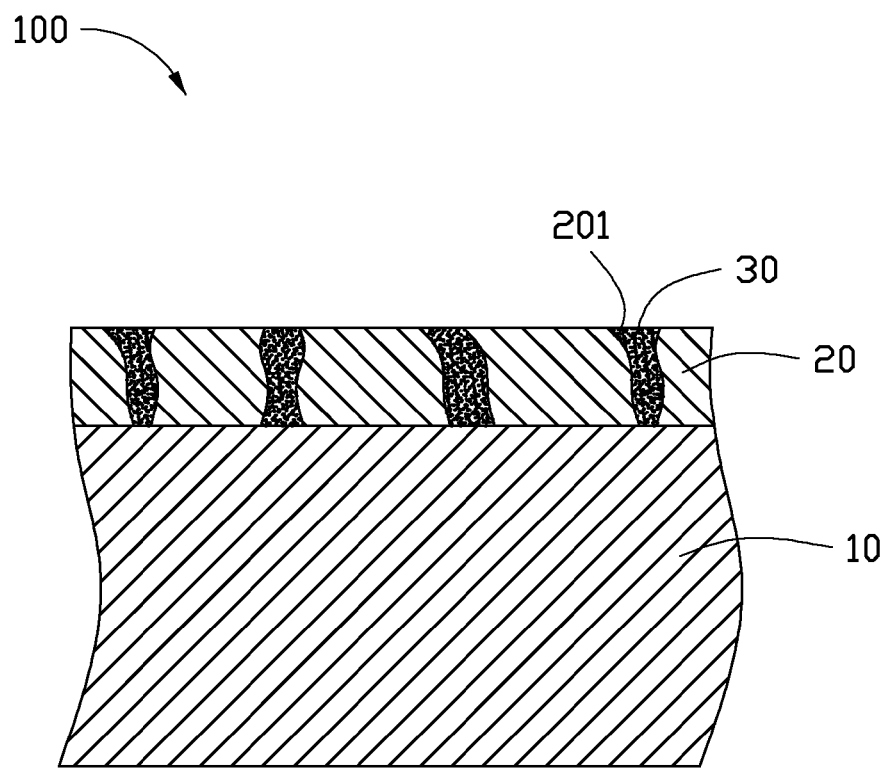
FIG. 1 illustrates a cross-sectional view of an embodiment of a coated article.

Referring to FIG. 1, a coated article 100 includes a substrate 10 and a coating 20 deposited on the substrate 10. The substrate 10 may be made of stainless steel, aluminum, aluminum alloy, ceramic or glass. The coating 20 is an aluminum titanium nitride layer having a thickness between 0.5 micrometers and 8 micrometers. The coating 20 may be deposited on the substrate 10 by magnetron sputtering. The coating 20 includes micropores 201 and sealing elements 30, and each micropore 201 is sealed by one of sealing elements 30. The sealing elements 30 may be formed in the following way: dipping the coated portion 20 of the coated article 100 in a solution including 40-60 g/L of $NaCOOCH_3$, 10-20 g/L of $HCOOCH_3$, 1-2 g/L of $NH_3.H_2O$, 2-8 g/L of $NaSO_4$, 1-5 g/L of $HNO_3$, and 2-6 g/L of $NaTiF_4$, and then dry the coating 20.

Figure 2:
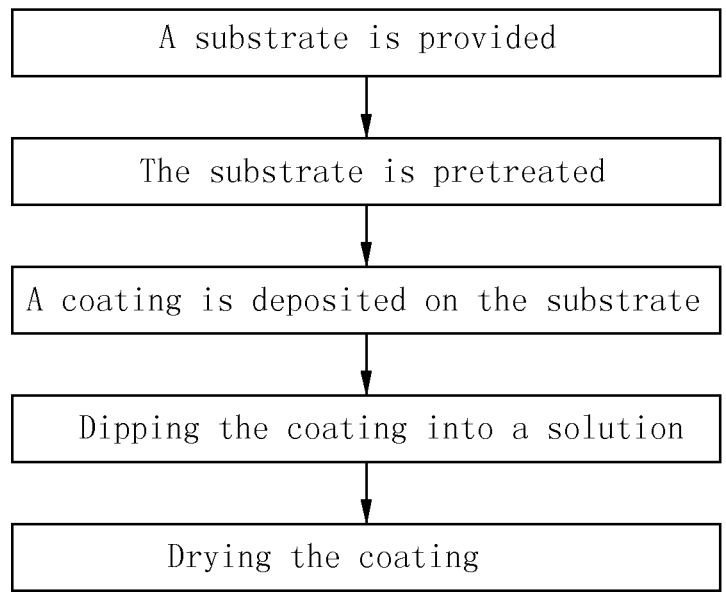
FIG. 2 is a summary diagram of a method for manufacturing the article in FIG. 2.
Figure 3:
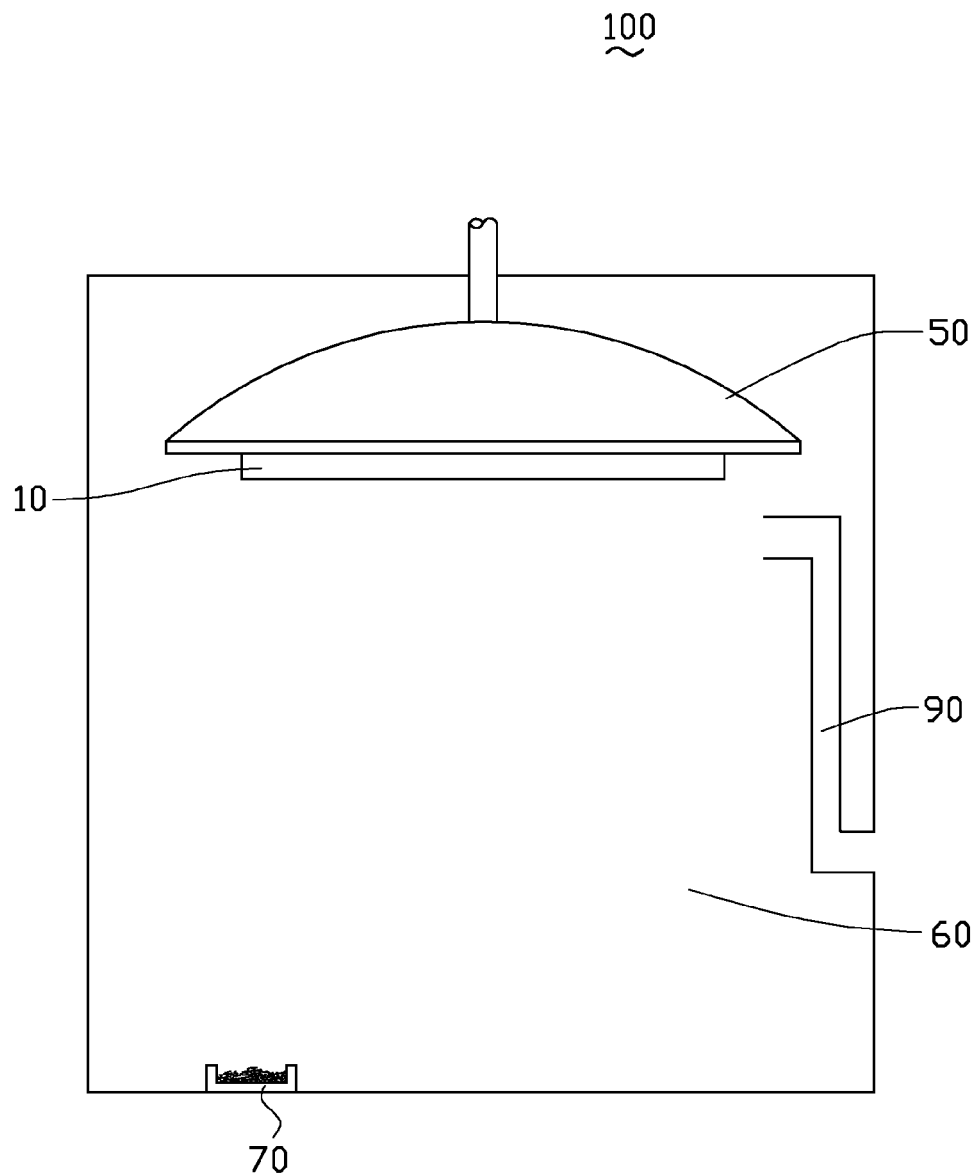
FIG. 3 is a schematic view of a magnetron sputtering coating machine for manufacturing the coated article in FIG. 1.

Referring to FIGS. 2 and 3, a method for manufacturing the coated article 100 may include at least the following steps.

Providing a substrate 10. The substrate 10 may be made of stainless steel, aluminum, aluminum alloy, ceramic or glass.

Pre-treating the substrate 10, by washing it with a solution (e.g., alcohol or acetone), which can be done in an ultrasonic cleaner, to remove impurities, such as grease or dirt. The substrate 10 is dried. The substrate 10 is then cleaned by argon plasma cleaning. The substrate 10 is retained on a rotating bracket 50 in a vacuum chamber 60 of a magnetron sputtering coating machine 100 with vacuum level at $8.0 \times 10^{-3}$ Pa. Pure argon is fed into the vacuum chamber 60 at a flux between about 50 Standard Cubic Centimeters per Minute (sccm) and 400 sccm from a gas inlet 90. A bias voltage applied to the substrate 10 is between −300 V to −600 V for about 5-10 minutes. Thus, the substrate 10 is washed by argon plasma, to further remove grease or dirt. As a result, the binding force between the substrate 10 and the coating 20 is enhanced.

A coating 20 is deposited on the substrate 10. Pure argon is fed into the vacuum chamber 60 at a flux between about 50 sccm and about 300 sccm, e.g., in this embodiment it is about 150 sccm, from the gas inlets 90. Nitrogen is fed into the vacuum chamber 60 at a flux between about 10 sccm and about 150 sccm from the gas inlets 90. A bias voltage applied to the substrate 10 is between about −100 volts and −350 volts. An aluminum titanium alloy target 70 in the vacuum chamber 60 is evaporated at a power between 4 kW and 14 kW, for between about 20 minutes and about 30 minutes, to deposit the coating 20 onto the substrate 10. The coating 20 has a thickness between 0.5 micrometers and 8 micrometers. The content of atomic aluminum in the aluminum titanium alloy target 70 is about 20~60 wt %. The coating 20 has a plurality of micropores 201.

Dipping the coated portion of the coated article 100 in a solution including 40-60 g/L of $NaCOOCH_3$, 10-20 g/L of $HCOOCH_3$, 1-2 g/L of $NH_3.H_2O$, 2-8 g/L of $NaSO_4$, 1-5 g/L of $HNO_3$, and 2-6 g/L of $NaTiF_4$, for between about 5 seconds to about 15 seconds. In this step, the temperature of the solution is set between 20 degrees Celsius (° C.) and 30° C. and the pH value of the solution is between 3 and 7. The coating 20 is washed by deionized water and then dried to form the sealing elements 30 in the micropores 201. The sealing elements 30 can seal the micropores 201, which can prevent penetration and corrosion by contaminants through the micropores 201, thereby improving the corrosion resistance of the coating 20.

When the coated article was put into a testing box, and 3.5 wt % of NaCl vapor fed into the testing box to test the coated article, the coated article did not corrode after about 60 hours.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for manufacturing a coated article, the method comprising:
   providing a substrate;
   depositing a coating on the substrate by magnetron sputtering, the coating comprising a plurality of micropores; and
   dipping the coated portion of the coated article in a solution including 40-60 g/L of NaCOOCH3, 10-20 g/L of HCOOCH3, 1-2 g/L of NH3-H2O, 2-8 g/L of NaS04, 1-5 g/L of HN03, and 2-6 g/L of NaTi to form a plurality of sealing elements, each sealing element filling in one of the micropores.

2. The method of claim 1, wherein during depositing the coating on the substrate, the substrate is retained in a vacuum chamber of a magnetron sputtering coating machine; pure argon is floated into the vacuum chamber at a flux between about 50 sccm and about 30 sccm; nitrogen is floated into the vacuum chamber at a flux between about 10 sccm and about 150 sccm; a bias voltage applied to the substrate is between about −100 volts and −350 volts; an aluminum titanium alloy target in the vacuum chamber is evaporated at a power between 4 kW and 14 kW, for between about 20 minutes and about 30 minutes, to deposit the coating to the substrate.

3. The method of claim 2, wherein the coating has a thickness between 0.5 micrometers and 8 micrometers.

4. The method of claim 2, wherein the content of atomic aluminum in the aluminum titanium alloy target 70 is about 20~60 wt %.

5. The method of claim 1, wherein the temperature of the solution is set between 20° C. and 30° C.

6. The method of claim 1, wherein the pH value of the solution is between 3 and 7.

7. The method of claim 1, further comprising a step of washing the coating by deionized water after the coating is dipping in the solution.

8. The method of claim 7, further comprising a step of drying the coating after the coating is washed by deionized water.

\* \* \* \* \*